(12) United States Patent
Voo

(10) Patent No.: US 8,983,789 B1
(45) Date of Patent: Mar. 17, 2015

(54) METHOD AND APPARATUS FOR FAST SENSOR BIASING

(75) Inventor: Thart Fah Voo, Singapore (SG)

(73) Assignee: Marvell International Ltd., Hamilton (BM)

(*) Notice: Subject to any disclaimer, the term of this patent is extended or adjusted under 35 U.S.C. 154(b) by 667 days.

(21) Appl. No.: 13/182,883

(22) Filed: Jul. 14, 2011

Related U.S. Application Data

(60) Provisional application No. 61/368,484, filed on Jul. 28, 2010, provisional application No. 61/383,999, filed on Sep. 17, 2010.

(51) Int. Cl.
  *G11B 5/03* (2006.01)
  *G01R 35/00* (2006.01)
  *G11B 5/00* (2006.01)

(52) U.S. Cl.
  CPC ...... *G01R 35/005* (2013.01); *G11B 2005/0018* (2013.01)
  USPC ........... 702/104; 702/107; 327/530; 327/545; 360/66

(58) Field of Classification Search
  CPC ......... G05F 1/10; G05F 3/262; G01R 35/005; G01R 33/09; G11B 5/02; G11B 2005/0018; G01D 18/008
  USPC ........................................................ 702/104
  See application file for complete search history.

(56) References Cited

U.S. PATENT DOCUMENTS

| | | | |
|---|---|---|---|
| 5,689,260 A * | 11/1997 | Vallancourt | 341/156 |
| 6,885,958 B2 * | 4/2005 | Yaklin | 702/107 |
| 7,076,384 B1 * | 7/2006 | Radulov et al. | 702/85 |
| 7,289,924 B2 * | 10/2007 | Muniraju et al. | 702/107 |
| 2007/0242384 A1 * | 10/2007 | Contreras et al. | 360/66 |

* cited by examiner

*Primary Examiner* — Mischita Henson
*Assistant Examiner* — Terence Stifter, Jr.

(57) ABSTRACT

A bias calibration circuit includes a first current source that can provide a majority biasing current, sufficient to provide most but not all of a desired bias voltage across a sensor. A second current source can provide a remaining amount of biasing current (minority biasing current) to provide a bias voltage across the sensor. In some embodiments, the current sources are programmable and codes are determined for programming the first and second current sources. The codes can be stored in a memory.

20 Claims, 11 Drawing Sheets

METHOD AND APPARATUS FOR FAST SENSOR BIASING

CROSS REFERENCE TO RELATED APPLICATIONS

This application claims priority to U.S. Provisional App. No. 61/368,484, filed Jul. 28, 2010 and to U.S. Provisional App. No. 61/383,999, filed Sep. 17, 2010, the entire disclosures of both of which are incorporated herein by reference for all purposes.

BACKGROUND

The present disclosure relates to sensors, and in particular to techniques for biasing of sensors.

Unless otherwise indicated herein, the approaches described in this section are not prior art to the claims in this application and are not admitted to be prior art by inclusion in this section.

Sensors are used for many purposes. For example, a temperature sensor may be incorporated on an IC chip (on-chip) for temperature measurement. A remote sensor may be provided off-chip and wired to a sense amplifier that is on-chip. An example of a emote sensor is in a magnetic sensor that is provided on read-write head of a magnetic disk drive device.

Typically, the output voltage of the sensor represents the property being measured. For example, a temperature sensor will have an output voltage that varies with temperature. A magnetic sensor will have an output voltage that varies with the strength of the magnetic field to which the sensor is exposed. Proper operation of a sensor typically requires biasing the sensor with a voltage so that the voltage swings of the sensor's output voltage vary linearly over the expected operating range of, for example, the temperature or magnetic field strength.

Sensors come in a variety of technologies, including passive resistive devices and active resistive devices such a MR (magneto resistive) devices, GMR (giant magneto resistive) devices, and TMR (tunneling magneto resistive) devices and so on. Biasing a sensor typically involves setting up a biasing current to flow through the sensor.

A current source can be employed to source enough current to set up a proper biasing voltage across the sensor that lies within the linear voltage region of the sensor. Current sources, however, tend to be noisy and current accuracy is difficult to achieve, especially if the sensor require high current levels to, set up a suitable bias voltage.

A resistor chain comprising a variable resistor connected in series with the sensor to a voltage source, $V_{src}$ may be. The variable resistor can be adjusted so that enough current flows to set up the proper biasing voltage ($V_{bias}$) across the sensor. Given the desired bias voltage and knowing the resistance of the sensor ($R_S$), it is a small matter of applying Ohm's law to determine a proper value ($R_{var}$) of the variable resistor. For example, according to Ohm's law, $V_{src}=I(R_{var}+R_S)$. The current that needs to flow through the sensor is computed as $$\frac{V_{bias}}{R_S}.$$

Therefore, $$V_{src} = \frac{V_{bias}}{R_S} \times (R_{var} + R_S)$$

and $$R_{var} = R_S \frac{V_{src} - V_{bias}}{V_{bias}}.$$

This approach requires an accurate measurement of the sensor resistance. Moreover, variable resistor circuits for integrated circuits are process dependent, and so accuracy can be difficult to achieve.

SUMMARY

Embodiments of the present disclosure provide fast biasing of a sensor. In one embodiment of the present invention, a first programmable current source is programmed based on inputs that represent a predetermined voltage and a resistance value of the sensor. A first current that is produced is sufficient to set up a voltage across the sensor that is less than the predetermined voltage. A second programmable current source is programmed in order to provide a second current, which when combined with the first current is sufficient to set up a voltage across the sensor that is less than or equal to the predetermined voltage. A memory stores codes for programming the current sources to produce the first current and the second current. In an embodiment, the first current is greater than the second current.

In an embodiment, a comparator compares the predetermined voltage with a voltage, across the sensor. The second programmable current source is programmed based on the comparison of the predetermined voltage with the voltage across the sensor.

In an embodiment, a current source provides a third current to the sensor that depends on a comparison of the predetermined voltage with the voltage across the sensor. The second programmable current source is programmed based on the third current.

In an embodiment, a third programmable current source is programmed in order to provide a third current, which when combined with the first and second currents is sufficient to setup a voltage across the sensor that is less than or equal to the predetermined voltage.

In an embodiment, a measurement circuit can be provided to measure the resistance value of the sensor.

In another embodiment of the present invention, a decoder received input representing a reference voltage and a resistance of the sensor. A programmable current source is programmed using a code based on the reference voltage and the resistance of the sensor. A variable current source connected to the sensor can source a current that depends on a voltage across the sensor. A selector connected to the current source can generate a code based on the current from the current source.

In an embodiment, additional programmable current sources are provided to source additional current to the sensor. The additional programmable current sources can be programmed by a selector.

The following detailed description and accompanying drawings provide a more detailed understanding of the nature and advantages of the present invention.

DETAILED DESCRIPTION

Described herein are techniques for biasing a sensor. In the following description, for purposes of explanation, numerous examples and specific details are set forth in order to provide a thorough understanding of the present invention. It will be evident, however, to one skilled in the art that the present disclosure as defined by the claims may include some or all of the features in these examples alone or in combination with other features described below, and may further include modifications and equivalents of the features and concepts described herein.

Figure 1:
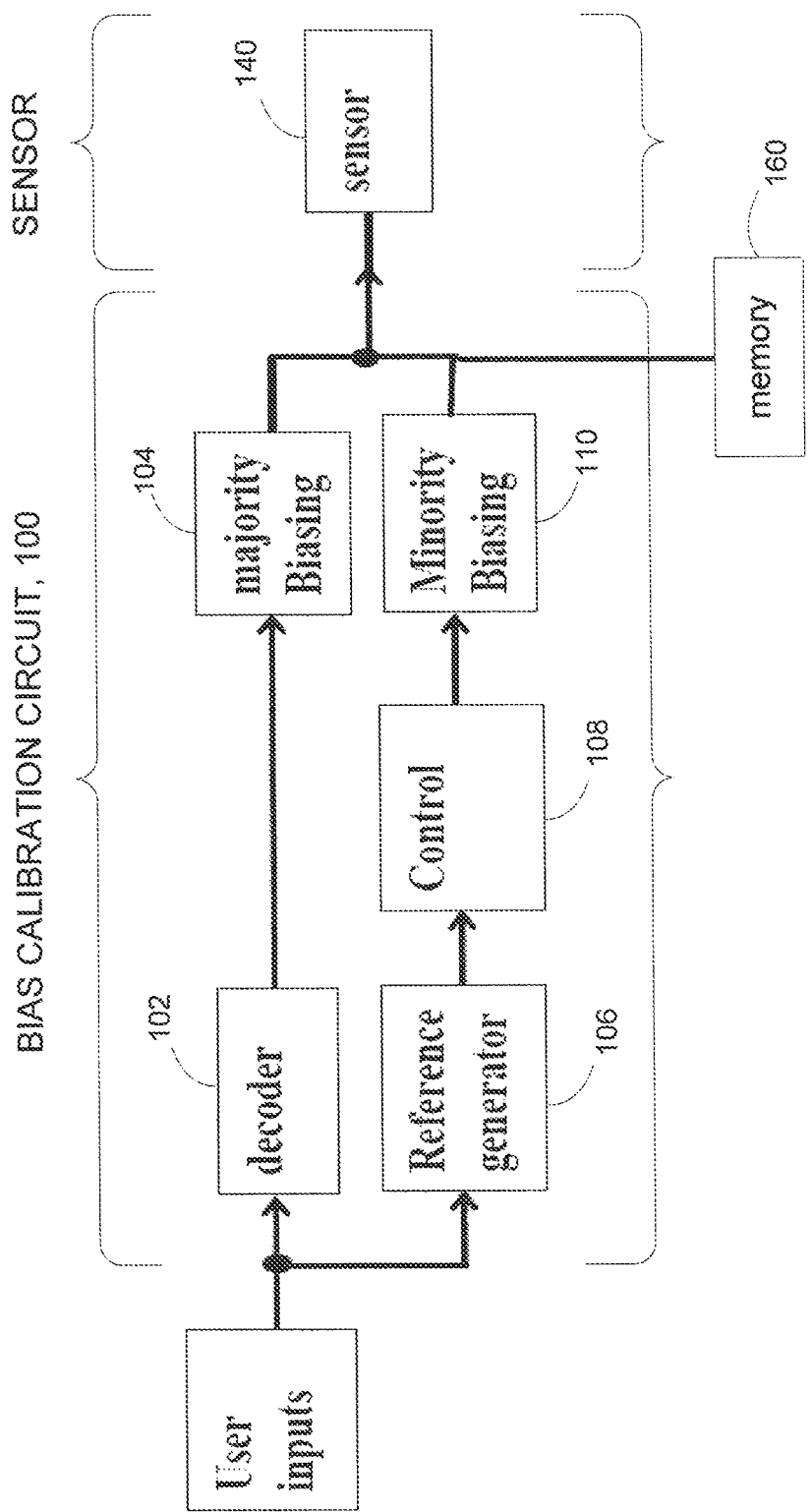
FIG. 1 illustrates a high level logical view of aspects of the present invention.

A high level logical view of aspects of the present disclosure is shown in FIG. 1. In accordance with embodiments of the present invention, a bias calibration circuit 100 can receive specification data from a user and generate data to bias a sensor 140 based on the specification data. The sensor 140 may be a passive resistor kind, or an active resistor kind such as MR, GMR, or TMR sensors, and in general can be any voltage-based sensor. The user input may be data input from a human user. In some embodiments, the user input may be provided from an automated source. In one embodiment, some of the user input can be input from another circuit. Accordingly, the user input will be referred to hereinafter simply as "input", "inputs", "input data", and so on.

The bias calibration circuit 100 includes a decoder 102 that decodes some of the input data to control a first biasing block 104. A reference voltage generator 106 decodes some of the input data to produce signals for a control block 108 which in turn controls a second biasing block 110. The first biasing block 104 and the second biasing block 110 are connected to the sensor 140. Based on the input data the bias calibration circuit 100 performs a calibration sequence to produce biasing data which can be used to bias the sensor 140 during active operation of the sensor. The biasing data can be stored in a memory 160 (e.g., flash memory) at the end of the calibration sequence.

In some embodiments, the bias calibration circuit 100 is disconnected from the sensor 140 after the biasing data has been stored in memory 160. For example, the bias calibration circuit 100 may include programmable fuses that connect the bias calibration circuit to the sensor 140. The fuses can then be programmatically "blown" to electrically isolate the bias calibration circuit 100 from the sensor 140 after the calibration sequence has completed. During subsequent active operation of the sensor 140, the data biasing data stored in the memory 160 can be read out and used to generate the proper biasing current. This aspect of the present disclosure will be discussed in more detail below. As used herein, the phrase "active operation" will refer to operation of the sensor 140 in an actual usage situation as distinguished from operation of the sensor relating to the calibration sequence for determining the biasing data.

Figure 1A:
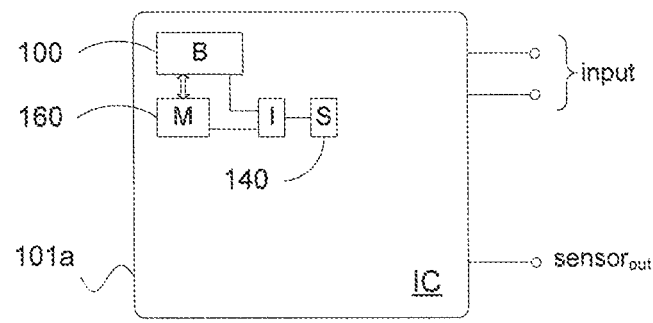
FIGS. 1A-1C illustrate typical configurations of a sensor circuit in accordance with embodiments of the present invention.
Figure 1B:
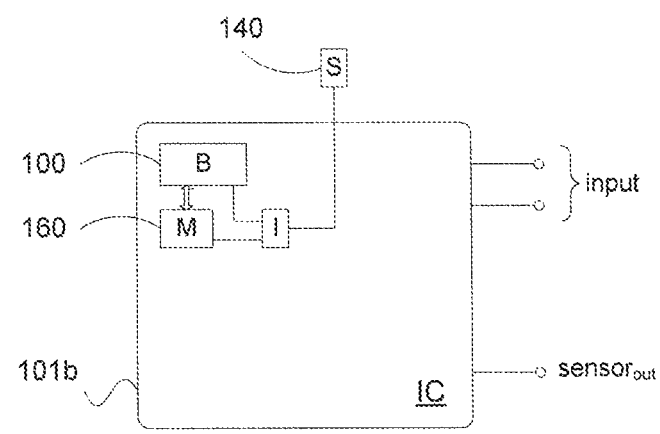
Figure 1C:
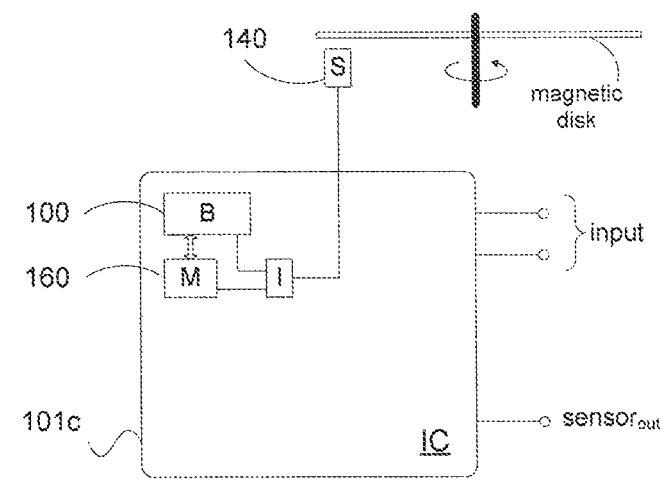

Typical usage scenarios of a sensor 140 in accordance with embodiments of the present disclosure are shown in FIGS. 1A-1C merely for illustrative purposes and are not intended in any way to limit the present invention. FIG. 1A, for example, illustrates an IC chip 101a having an on-board sensor 140. The IC chip 101a comprises circuitry including a memory 160 (such as flash memory), a programmable current generator block I, and a bias calibration circuit 100. The IC chip may include pins for data and/or signal input and output. Prior to using the IC chip 101a (e.g., during manufacture), the bias calibration circuit 100 can be operated to produce biasing data that is then stored in the memory 160. The bias calibration circuit 100 can then be electrically disconnected from the sensor 140 after the biasing data is determined and stored in memory 160. During operation, the biasing data can be loaded from memory 160 into the programmable current generator block I to produce the current needed to properly bias the sensor 140 for active operation. The IC chip 101a may include a pin for reading out the sensor output during active operation of the sensor 140.

FIG. 1B shows an off-chip configuration where the sensor 140 is separate from the IC chip 101b. The sensor 140 can be connected to the IC chip 101b via a suitable wired connection. Such configurations may be suitable where the sensor 140 is positioned in a location that cannot accommodate the whole IC chip 101b. FIG. 1C, for example, is a schematic illustration of such a usage scenario. In FIG. 1C, the sensor 140 may be a component in a read/write head of a magnetic disk drive unit. Read/write heads can be very small and thus have room only for the sensor. The supporting IC chip 101c can be distantly located and connected by wires to the sensor 140.

Figure 2:
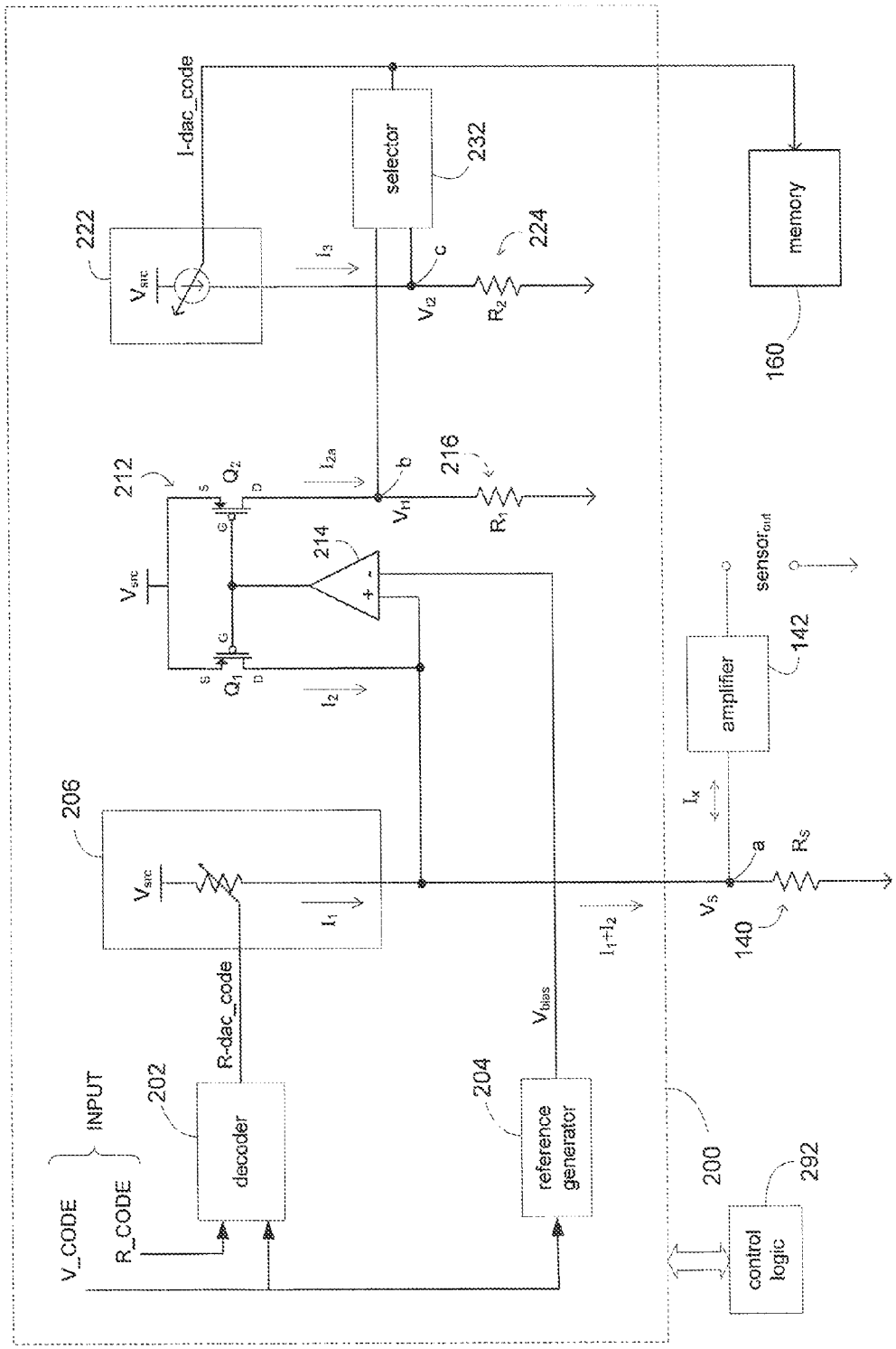
FIG. 2 shows a bias calibration circuit in accordance with an embodiment of the present invention.

FIG. 2 shows a bias calibration circuit 200 in accordance with an embodiment of the present invention. The bias calibration circuit 200 is connected to a sensor 140. The sensor 140 is illustrated in the figure as a resistor having a resistance of $R_S$. A sense amplifier 142 may be connected to the sensor 140 to amplify the voltage across the sensor during active operation. The bias calibration circuit 200 is also connected to memory 160 for non-volatile storage of the biasing data that is produced by the bias calibration circuit.

Input data is provided to a decoder 202, including V_Code and R_Code. In some embodiments, the input data is digital data; e.g., 8-bit data, 16-bit data, etc. V_Code represents the value of a bias voltage ($V_{bias}$) that is desired across the sensor 140 during active operation. R_Code represents the value of the resistance $R_S$ of the sensor 140. As will become clear in the discussions below, an advantageous aspect of the present disclosure is that a precise value for the resistance $R_S$ need not be specified.

Figure 2A:
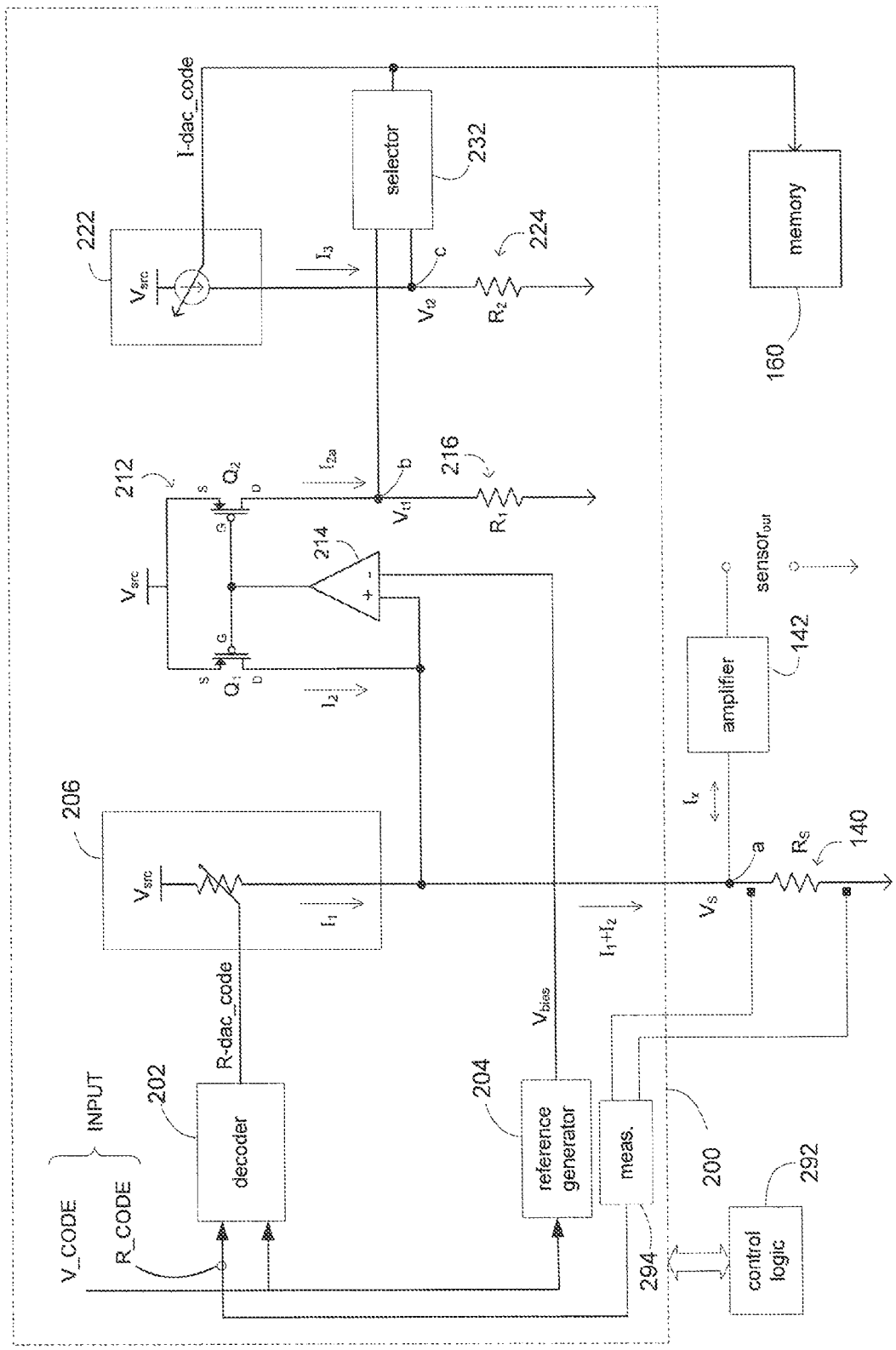
FIG. 2A shows an embodiment of the bias calibration circuit of FIG. 2, illustrating the use of a measuring circuit to measure a resistance of the sensor.

The input data can be externally provided. For example, the V_Code may be input by a user through a suitable connection to a data input device. Likewise, the R_Code may be input by a user through the same or similar connection. Referring to FIG. 2A for a moment, in another embodiment of the present disclosure a measurement circuit 294 can be provided to measure the resistance of the sensor 140. The measurement circuit 294 can be any of a number of suitable and well known designs. The measurement circuit 294 can be further configured to produce an appropriate R_Code value to the decoder 202. The measurement circuit 294 can deemed to be part of the bias calibration circuit 200 as shown in FIG. 2A, or it can be deemed to be separate from the bias calibration circuit. It will be appreciated that the other embodiments of the present disclosure disclosed herein can incorporate the measurement circuit 294 as well.

Returning to FIG. 2, the decoder 202 can produce an output R-dac_code that is fed into a programmable current source 206 to produce a current $I_1$. The programmable current source 206 is electrically connected to the sensor 140 to source the current $I_1$ to the sensor. Any of a number of known suitable designs can serve as the programmable current source 206. The design may comprise passive resistive elements (as indicated by the circuit symbol in FIG. 2), or may be an active device. In an embodiment, for example, the programmable current source 206 may be programmable with an 8-bit binary value to provide 255 levels of current. The R-dac_code produced by the decoder 202 can be an 8-bit value to program the programmable current source 206 accordingly.

The input data V_Code is also fed into a voltage reference generator 204. The output of the voltage reference generator 204 is a voltage $V_{bias}$ that is specified by V_Code. The output of the voltage reference generator 204 is fed into a feedback loop 212. The feedback loop 212 comprises a comparator 214 connected to a variable current source. In an embodiment, the variable current source comprises current mirror provided by a pair of matched transistors $Q_1$ and $Q_2$; e.g., PMOS transistors.

In an embodiment, the comparator 214 comprises an op-amp. The output of the voltage reference generator 204 is connected to an inverting input of the op-amp 214. A non-inverting input of the op-amp 214 is connected to sense the voltage $V_S$ of the sensor 140 at node "a". An output of the op-amp 214 drives the current mirror $Q_1$ and $Q_2$. The current $I_2$ sourced by transistor $Q_1$ is fed to the sensor 140. The current $I_{2a}$, sourced by transistor $Q_2$ is fed to a resistor 216. In an embodiment, the resistances $R_1$ and $R_2$ respectively of resistors 216 and 224 are equal.

A voltage $V_{t1}$ developed across resistor 216 at node "b" can be sensed by the selector 232 at an input of the selector. A programmable current source 222 is connected to a resistor 224 at a node "c" and sources a current $I_3$ to the resistor. A voltage $V_{t2}$ across resistor 224 is developed at node "c" and can be sensed by the selector 232 at a second input of the selector.

Any of a number of known suitable designs can serve as the programmable current source 222. In an embodiment, for example, the programmable current source 222 may be programmable with an 8-bit binary value to provide 255 levels of current. The I-dac_code produced by the selector 232 can be an 8-bit value to program the programmable current-source 222 accordingly.

In some embodiments, the selector 232 may comprise a combination of analog circuitry and digital logic circuitry. For example, the selector 232 may include an op-amp to compare $V_{t1}$ and $V_{t2}$. Digital logic may be used to convert or otherwise map an output of the op-amp to a obtain a suitable value for I-dac_code which feeds into the programmable current source 222.

The amplifier 142 may source or sink a certain amount of current $I_x$ to/from the sensor 140 during active operation. The current $I_x$ is referred to herein as a "leakage" current and can either add to or subtract from the current that flows through the sensor 140. Accordingly, the current that can flow through the sensor 140 includes the current $I_1$ from the programmable current source 206, the current $I_2$ sourced from transistor $Q_1$, and the leakage current $I_x$. Accordingly, the current flow through the sensor 140 is $I_1+I_2+I_x$ (where $I_x$ can be positive or negative, depending on the direction of flow of the leakage current). A voltage $V_S$ across the sensor 140 is taken at a node "a" in order to account for the three current flows through the sensor 140. In some embodiments, the amplifier may be placed in an active mode (e.g., power can be supplied to the amplifier 142) during a bias calibration sequence. This way any current leakage $I_x$ that may be produced by the amplifier 142 during active operation of the sensor 140 can be taken into account in determining the biasing data.

In some embodiments, the transistors $Q_1$ and $Q_2$ in the current mirror are matched in that their electrical characteristics are substantially the same. Accordingly, substantially the same current will be sourced through each transistor when the current mirror is biased. Resistors 216 and 224 have the substantially the same resistance, namely $R_1=R_2$. However, it can be appreciated that the transistors $Q_1$ and $Q_2$ need not be matched, and the resistors 216 and 224 need not have the same resistance. One of ordinary skill can make suitable design choices as to the transistor characteristics and resistor values in accordance with present invention.

Figure 3:
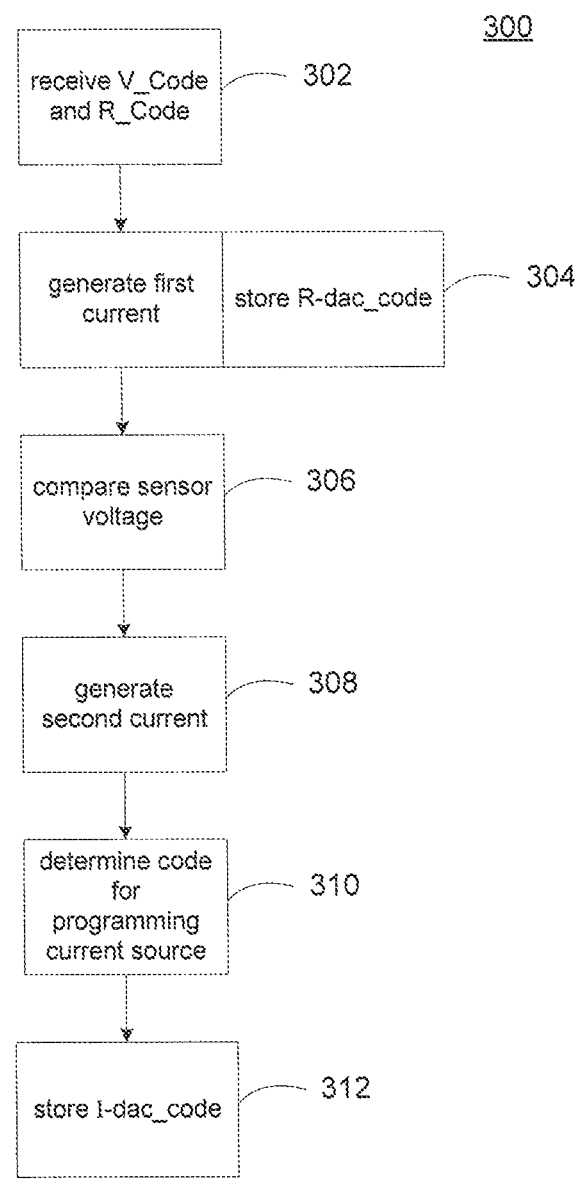
FIG. 3 is a flow chart of a bias calibration operation in accordance with the present invention.

FIG. 3 shows a process 300 in connection with FIG. 2 for a bias calibration sequence in accordance with embodiments of the present disclosure to obtain the biasing data for the sensor 140 to properly bias the sensor during active operation. It will be appreciated that suitable control logic (292, FIG. 2) can be provided to operate and coordinate operation of the components during a bias calibration sequence. One of ordinary skill will further appreciate that such control logic 292 may be firmware, Field Programmable Gate Array (FPGA) logic or other such logic gates, custom logic circuits, and so on, including combinations of the foregoing.

At 302, an input V_Code is received which represents a desired bias voltage level for the sensor 140. A human user can provide V_Code using a suitable input device. A suitable computer machine interface can be used to input V_Code. R_Code can be input to the bias calibration circuit 200 in the same or similar manner as V_Code. R_Code represents a resistance value of the sensor 140. As explained above, R_Code can be obtained from a built-in measurement circuit 294 such as shown in FIG. 2A to measure a resistance of the sensor 140 and produce data representative of the measured resistance.

At 304, a first current $I_1$ is produced. In some embodiments, the decoder 202 in FIG. 2 may compute or otherwise determine a current value based on the received V_Code and R_Code; e.g., dividing the voltage value (represented by V_Code) by the resistance value (represented by R_Code). A corresponding value for R-dac_code may then be obtained. In some embodiments, the decoder 202 may obtain R-dac_code directly from V_Code and R_Code, for example using a table look-up method. The R-dac_code that is produced by the decoder 202 serves to program the programmable current source 206 to source the current $I_1$ to the sensor 140. The R-dac_code is stored in the memory 160 as biasing data.

Due to the digital nature of the decoder 202 and programmable current source 206 in some embodiments of the present invention, it may not be practical for the programmable current source 206 to generate a precise current that, by itself, can bias the sensor 140 with the desired bias voltage. For example, the input value R_Code may not be able to represent the resistance value of the sensor 140 with sufficient precision. The decoder 202 may not have sufficient precision to compute the current value from V_Code and R_Code. The programmable current source 206 may not have sufficient precision to generate a suitably precise current, and so on.

While the use of high precision digital to analog (D/A) components may provide a more accurate bias voltage, the increased layout area and increased cost of such high precision circuitry may not be justifiable. In accordance with the present invention, the current that is generated by the programmable current source 206 would set up a voltage across the sensor 140 that is less than the desired bias voltage. As explained, the R-dac_code (which translates to the current $I_1$) is determined by the decoder 202 based on the inputs V_Code and R_Code. In an embodiment, the decoder 202 can deliberately select a value for R-dac_code that is based on a voltage that is less than the voltage represented by V_Code. The current $I_1$ specified by R-dac_code would, by itself, create a voltage across the sensor 140 that is less than the desired bias voltage specified by V_Code. This portion of the bias calibration sequence can be referred to as "majority biasing" where "most" of the desired bias voltage can be established, but not all of it.

Consider as a running hypothetical the following scenario to illustrate this idea of majority biasing. Suppose the specified V_Code and R_Code for the sensor 140 requires a current of 2.24 mA to achieve the desired bias voltage. Suppose the programmable current source 206 is designed to source a maximum (full range) of 3.2 mA in increments (steps) of 0.1 mA. In accordance with the present invention, the current sourced by the programmable current source 206 could be 2.2 mA, since the next higher increment (2.3 mA) would bias the sensor 140 with too high of a voltage. The 2.2 mA bias current would be an example of majority biasing because that current provides most of the bias voltage needed to bias the sensor 140 with the desired bias voltage. The R-dac_code that is produced, then, would be a value that programs the programmable current source 206 to source 2.2 mA.

Continuing with the bias calibration sequence 300, the reference generator 204 outputs a voltage based on the V_Code which constitutes a desired bias voltage $V_{bias}$ as specified by a user. The bias voltage $V_{bias}$ serves as a reference voltage in the comparator 214 of the feedback loop 212. The bias voltage $V_{bias}$ is compared to the sensor voltage $V_S$ (block 306) taken from node "a". Initially, $V_S$ is less than $V_{bias}$ by virtue of $I_1$ having been determined in the manner discussed above. Accordingly, a non-zero voltage will appear at output of the op-amp 214. The non-zero output voltage of op-amp 214 will turn ON transistors $Q_1$ and $Q_2$. Currents $I_2$ and $I_{2a}$ will be sourced respectively from transistors $Q_1$ and $Q_2$ (block 308). The currents $I_1$ and $I_{2a}$ combine to drive up the voltage $V_S$. As the difference between $V_{bias}$ and $V_S$ decreases, so will the output of op-amp 214. As the output of the op-amp 214 decreases, this will tend to decrease the currents $I_2$ and $I_{2a}$ that are sourced respectively from $Q_1$ and $Q_2$. Because of this feedback, a steady state condition arises where current $I_2$ becomes constant.

The current $I_{2a}$ that is sourced by $Q_2$ is fed through resistor 216. The voltage $V_{r1}$ developed across resistor 216 is sensed by selector 232. The selector 232 outputs a value I-dac_code that is based on a comparison between the voltage $V_{r1}$ and the voltage $V_{r2}$ which is a voltage across resistor 224 that arises when current $I_3$ is sourced from programmable current source 222. In accordance with some embodiments, the selector 232 is configured to output a value of I-dac_code to program the programmable logic 222 to increase or decrease the current $I_3$ in order to minimize the difference between $V_{r1}$ and $V_{r2}$ (block 310). In principle, the minimum difference is zero. However, in practice the minimum difference will likely be a non-zero difference largely because of the digital nature and limited precision of the programmable current source 222. In an embodiment, the selector 232 produces a value of I-dac_code where the relationship $V_{r1} \geq V_{r2}$ is true.

In an embodiment, when the programmable current source 222 sources a current $I_3$ that results in a minimum difference between $V_{r1}$ and $V_{r2}$ and where $V_{r1} \geq V_{r2}$ then the corresponding I-dac_code is stored to memory 160 (block 312) as biasing data in addition to the R-dac_code. This phase of the bias calibration sequence 300 can be referred to as "minority biasing." Whereas, most of the biasing current $I_1$ was determined during the majority biasing phase of the bias calibration sequence 300, minority biasing serves to provide the remaining additional current $I_3$ so that a current equal in magnitude to the sum of the currents $I_1$ and $I_3$ can properly bias the sensor 140 during active operation to produce a voltage across the sensor that is less than or equal to the desired bias voltage. In some embodiments, the current $I_1$ is larger than $I_3$ because the majority biasing is intended to produce most of the current to the sensor 140, while the minority biasing is intended to produce a smaller amount of current to the sensor.

Recall the running hypothetical introduced above, where the sensor 140 requires a current of 2.24 mA to be biased with the desired bias voltage and the majority biasing can only provide 2.2 mA. Suppose the programmable current source 222 is designed to source a maximum current of 0.32 mA in increments of 0.02 mA. The foregoing minority biasing phase could result in an I-dac_code that programs the programmable current source 222 to source a minority biasing current of 0.04 mA, and combined with the 2.2 mA from the programmable current source 206 a total of 2.24 mA would be sourced to the sensor 140.

Figure 4:
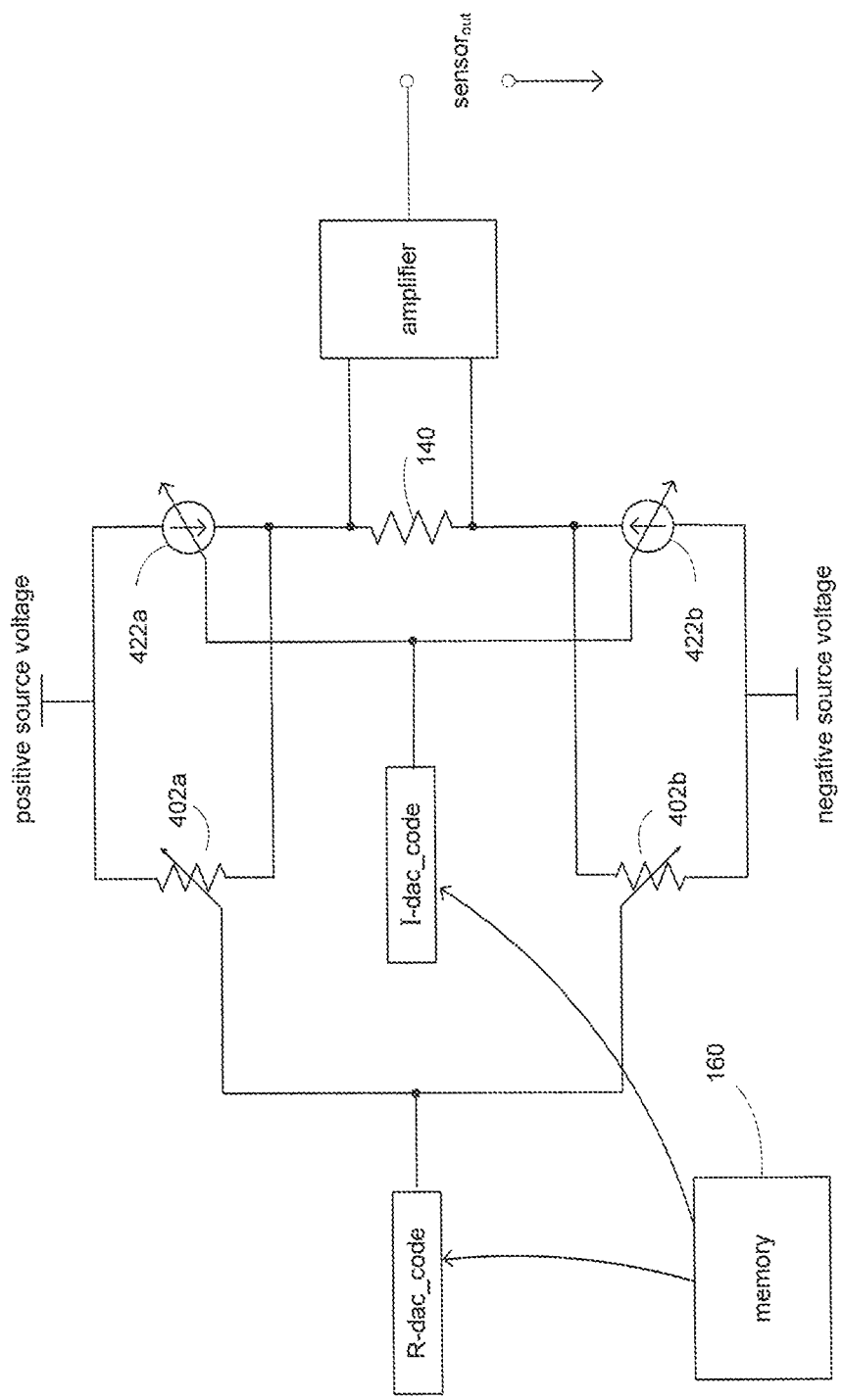
FIG. 4 illustrates a typical configuration for active operation of a sensor that has been bias in accordance with the present invention.

During active operation, the biasing data previously obtained from bias calibration sequence and stored in memory 160 can be read out of the memory and loaded into corresponding programmable current sources (e.g., FIG. 4, 402a, 422a). For example, the R-dac_code value can be loaded from memory 160 into a first programmable current source 402a. Similarly, the I-dac_code value can be loaded from memory 160 into a second programmable current source 402b.

In some embodiments, the programmable current sources that were used during the bias calibration sequence may be used during active operation of the sensor 140. For example, portions of the bias calibration circuit 200 can be electrically disconnected or otherwise isolated, leaving only the programmable current sources 206 and 222 which can then be used during active operation. The programmable current source 222 can be programmed with the biasing data stored the memory 160.

An example of active operation of a sensor calibrated in accordance with the present disclosure is explained in connection with FIG. 4. The particular configuration shown in the figure represents differential circuit arrangement for the sensor 140. A first set of programmable current sources 402a, 422a are connected to a positive source voltage. A second set of programmable current sources 402b, 422b are connected to a negative source voltage. The memory 160 contains values for R-dac_code and I-dac_code which were determined in an earlier bias calibration sequence. The R-dac_code can be read out of memory 160 and be used to program the programmable current sources 402a, 402b. Likewise, the I-dac_code can be read out of memory 160 and be used to program the programmable current sources 422a, 422b.

Figure 5:
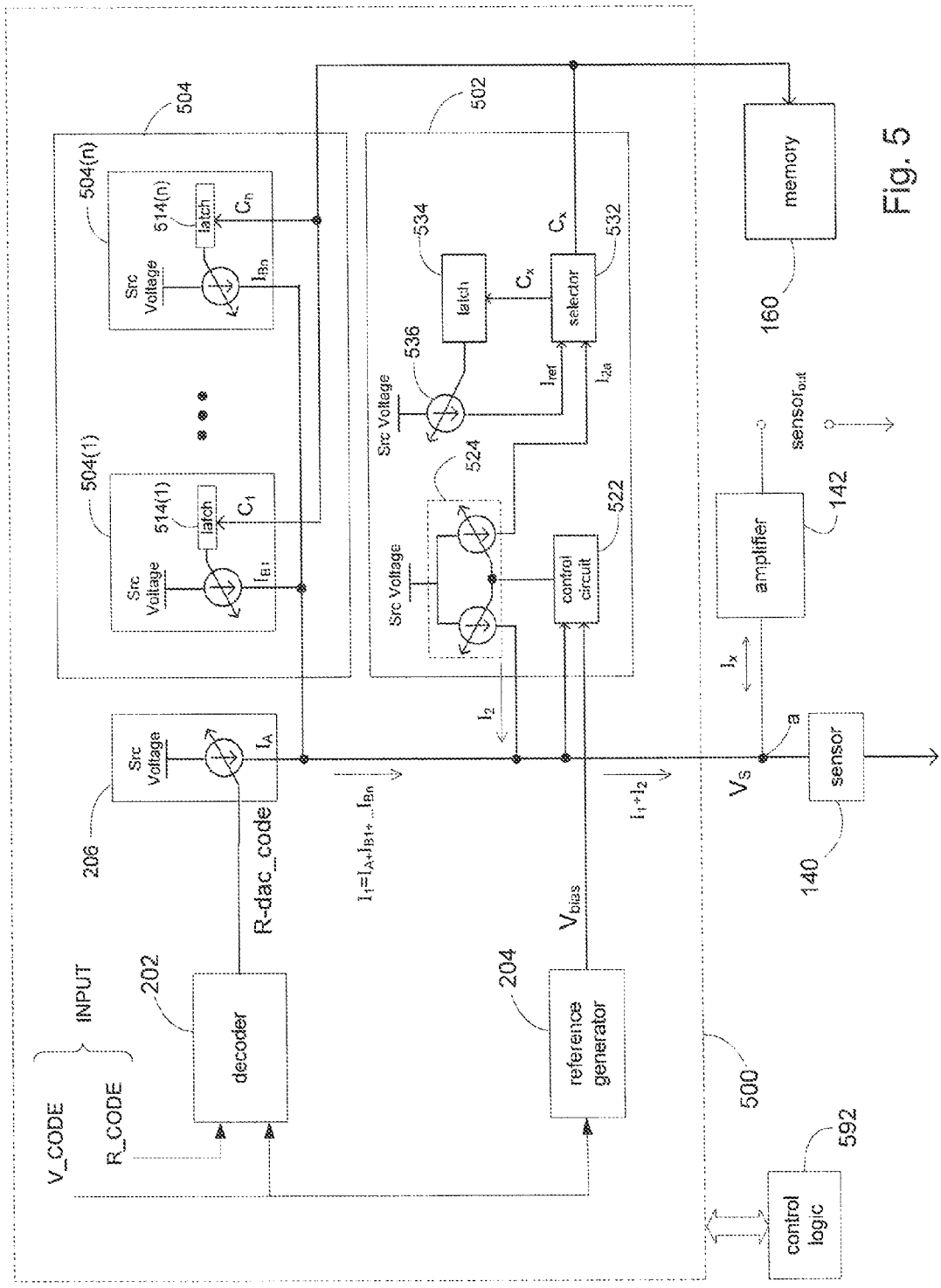
FIG. 5 shows an embodiment using a plurality of programmable current sources for determining a minority biasing current in accordance with the present invention.

FIG. 5 shows another embodiment in accordance with the present invention. Elements in FIG. 5 that are common to the elements shown in previous figures are identified by the same reference numerals. The bias calibration circuit 500 shown in FIG. 5 comprises inputs. V_Code and R_Code, where V_Code represents a desired bias voltage across the sensor 140 and R_Code represents a resistance value of the sensor. A measurement circuit 294 such as depicted in FIG. 2A can be incorporated in an embodiment of the circuit of FIG. 5 as an alternative source of R_Code. Control logic 592 provides control and sequencing in the bias calibration circuit 500 in accordance with a bias calibration sequence that will be discussed below.

A decoder 202 provides an output R-dac_code as discussed above. A programmable current source 206 sources a certain amount of current to the sensor 140. The R-dac_code programs the programmable current source 206 to source a current $I_A$. As explained above in connection, with the current $I_1$ in FIG. 2, the current $I_A$ provides a biasing current to the sensor 140 and creates a voltage across the sensor which constitutes a large portion of the desired bias voltage. A calibration block 502 controls a bank of programmable current sources 504 to source additional current that will make up a remaining portion of the desired bias voltage across the sensor 140.

A voltage reference generator 204 receives V_Code and outputs a voltage $V_{bias}$ that constitutes the desired bias voltage for biasing the sensor 140 during active operation of the sensor. As will be explained, the desired bias voltage $V_{bias}$ serves as a reference voltage in the calibration block 502.

The calibration block 502 comprises a control circuit 522 that controls a variable current source comprising current source 524. Current source 524 is connected to the sensor 140 to source a current $I_2$ to the sensor. Current source 524 is also connected to a selector block 532 to source a current $I_{2a}$ to the selector block. The control circuit 522 is connected to the sensor 140 to sense a voltage $V_S$ across the sensor. The control circuit 522 is configured to compare the voltage $V_S$ with the reference voltage $V_{bias}$. The output of the control circuit represents a result of the comparison and serves to control the current that is sourced by the current source 524 as a function of the comparison between the voltage $V_S$ with the reference voltage $V_{bias}$.

The calibration block 502 further includes a programmable-current source 536 that can source a current $I_{ref}$ to the selector block 532. An output of the selector block 532 is connected to provide a code $C_x$ to program the programmable current source 536. A latch 534 can be provided to store the code $C_x$. Another output of the selector block 532 is connected to the bank of programmable current sources 504 and to the memory 160.

The bank of programmable current sources 504 comprises individual programmable current sources 504(1) to 504(n). Each programmable current source 504(1)-504(n) receives the code $C_x$ from the selector 532 as input, and source an amount of current $I_{B1}$ to $I_{Bx}$ based on the received code. Each programmable current source 504(1)-504(n) can store its received code $C_x$ in a respective latch 514(1)-514(n). Outputs of the programmable current sources 504(1)-504(n) are connected to source their current to the sensor 140. A total current $I_1$ sourced to the sensor 140 by the programmable current source 206 and the bank of programmable current sources 504 is determined as:

$$I_1 = I_A + I_{B1} + \ldots I_{Bn}.$$

In one embodiment, each programmable current source 504(1)-504(n) can have the same range and resolution of current generating capability. For example, each programmable current source 504(1)-504(n) can be designed to source a maximum of 10 mA in increments of 0.5 mA. In another embodiment, each programmable current source 504(1)-504(n) can varying ranges and resolutions of current generating capability. For example programmable current source 504(1) might be able to source a maximum of 0.32 mA in increments of 0.04 mA. A programmable current source 504(2) might be able to source 0.032 mA in increments of 0.004 mA, and so on. In practice, the design of each programmable current source 504(1)-504(n) will be dictated by design requirements and constraints of the system.

Figure 5A:
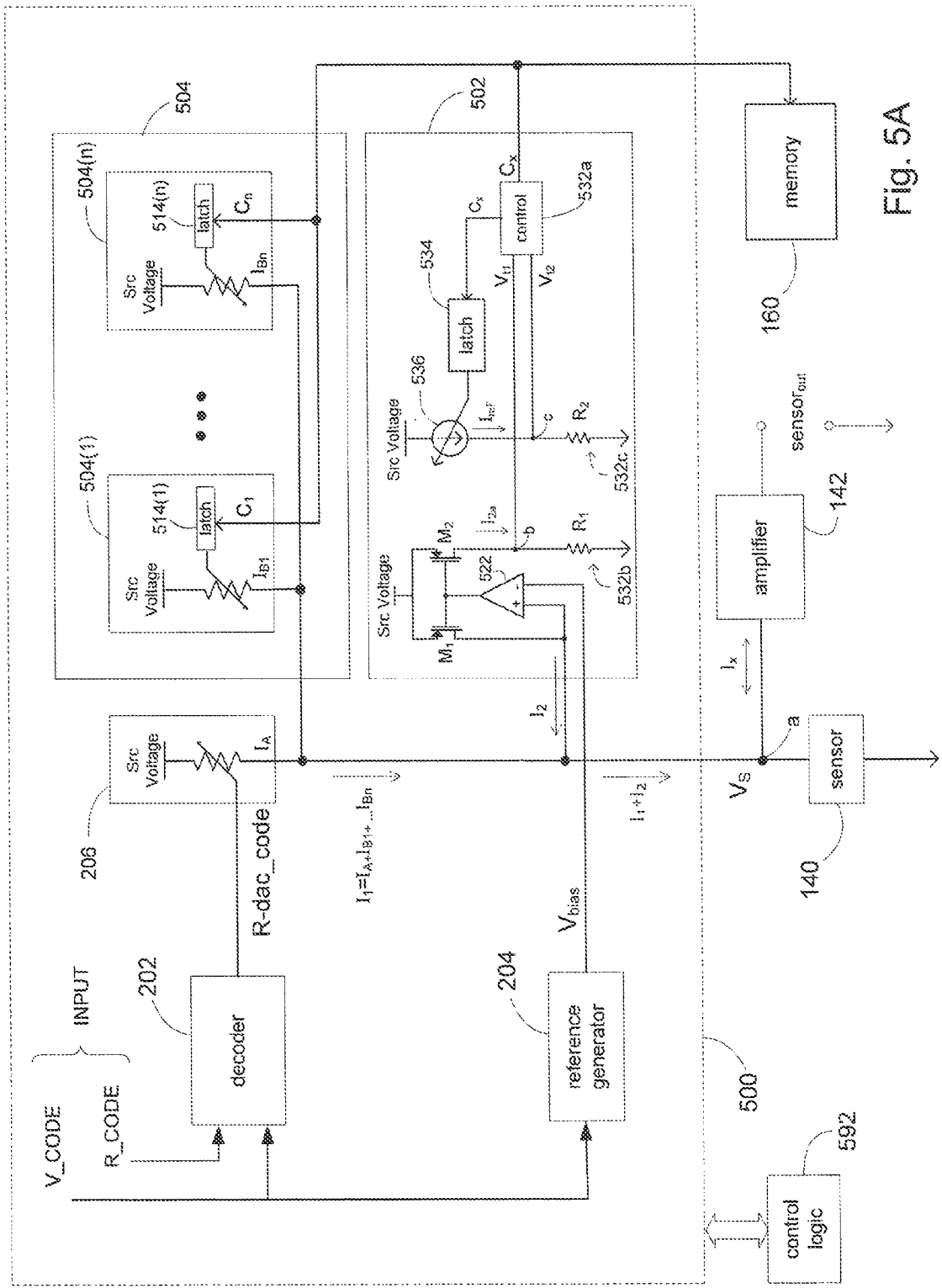
FIG. 5A shows an embodiment of FIG. 5 illustrating some implementation details.

Referring for a moment to FIG. 5A, illustrative examples of the current sources and control circuits shown in FIG. 5 are discussed. For example, the programmable current sources 206, 504(1)-504(n) can be passive resistive devices (as shown in FIG. 5A), or in other embodiments can be active devices.

In some embodiments, the control circuit 522 can be a comparator 522 (e.g., an op-amp) and the variable current source 524 can comprise two PMOS transistors $M_1$, $M_2$. An output of the comparator 522 can serve to bias PMOS devices $M_1$, $M_2$ to cause a flow of current that varies depending on the level of the comparator's output.

In some embodiments, the selector 532 may comprise control circuit 532a and resistors 532b, 532c. The currents $I_{2a}$, $I_{ref}$ that enter the selector 532 can be sourced respectively into resistors 532b, 532c. Respective voltages $V_{r1}$, $V_{r2}$ developed across resistors 532b, 532c at respective nodes "b", "c" can be compared by the control circuit 532a. For example, the control circuit 532a may employ a comparator. The output of such a comparator may be used to determine or otherwise select a code $C_x$, which could then be latched by the latch 534 thereby holding the value of $C_x$.

Figure 6:
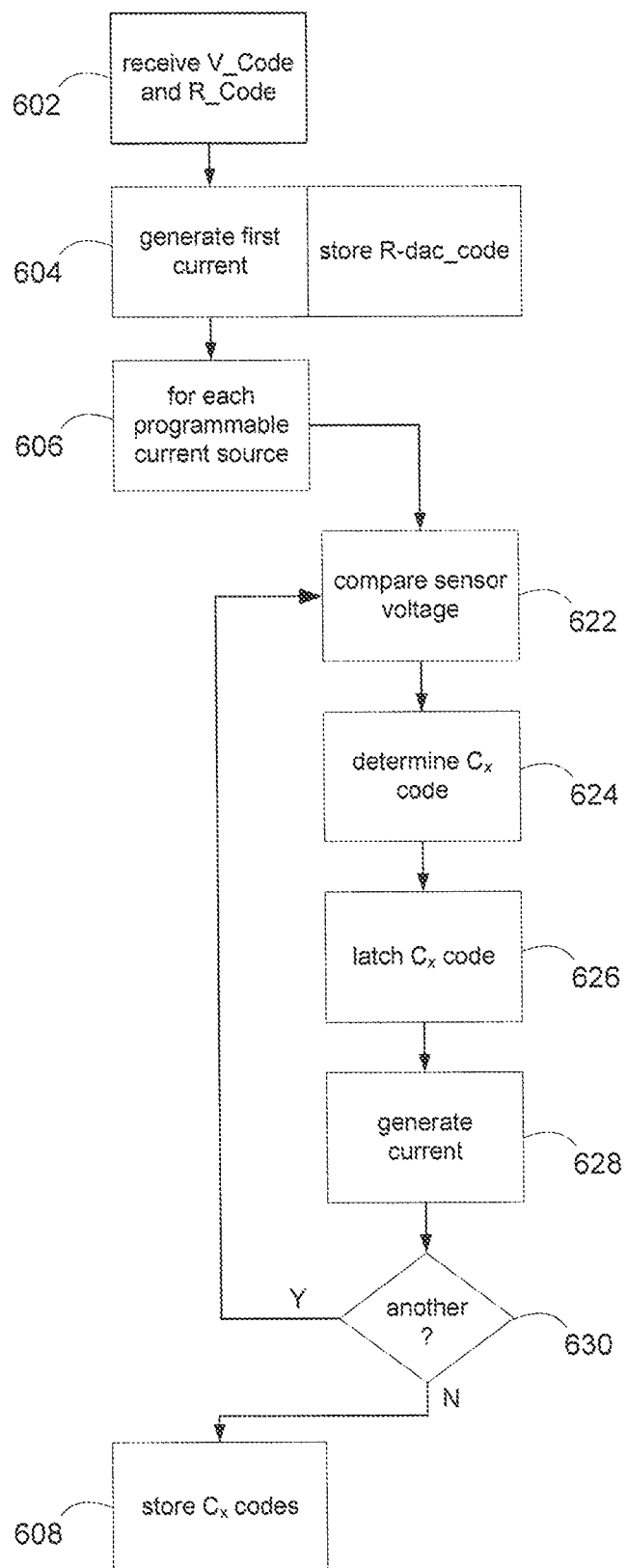
FIG. 6 is a flow chart of a bias calibration operation in accordance with the present invention.

Referring now to FIG. 6, a discussion of bias calibration in accordance with the bias calibration circuit embodiment shown in FIG. 5 will be given with respect to the process flow 600. It will be appreciated that suitable control logic (592, FIG. 5) can provided, to operate and coordinate operation of the components during a bias calibration sequence. One of ordinary skill will further appreciate that such control logic 592 may be comprise firmware, FPGA (field programmable gate array) logic or other such logic gates, custom logic circuits, and so on, or combinations of the foregoing.

At 602, inputs V_Code and R_Code are received. V_Code represents a desired bias voltage level for the sensor 140. R_Code represents a resistance value of the sensor 140. In some embodiments, R_Code can be obtained from a built-in measurement circuit such as shown in FIG. 2A to measure a resistance of the sensor 140 and produce data representative of the measured resistance.

At 604, a first current $I_A$ is produced. In some embodiments, the decoder 202 may compute or otherwise determine a value for R-dac_code as discussed above in FIG. 3. R-dac_code can then be used to program the programmable current source 206. R-dac_code can be stored in memory 160 as biasing data.

At 606, each of the programmable current sources 504(1)-504(n) can be programmed in the following iterative manner. Initially, each of the programmable current sources 504(1)-504(n) is turned off; e.g., by latching a value of "0" in each of the latches 514(1)-514(n). In a first iteration, the voltage $V_S$ across the sensor 140 arises from the current $I_A$. At 622, the control circuit 522 in calibration block 502 compares the voltage $V_S$ with the reference voltage $V_{bias}$ and controls the variable current source 524 in accordance with the comparison. In particular, the control circuit 522 will force the current $I_2$ to drive $V_S$ toward $V_{bias}$. At the same time, the mirrored current $I_{2a}$ is sensed by the selector 532 to encode $C_x$ (block 624). In some embodiments, the selector 532 may iteratively change $C_x$, including latching the value into latch 534 to program the programmable current source 536 to source an amount of current $I_{ref}$. A value of $C_x$ can be obtained where $I_{ref}<I_2$. At 626, the code $C_x$ is latched into the first programmable current source 504(1) in the first iteration. The programmable current source receiving the code $C_x$ is thus programmed and sources a corresponding current (block 628). In the next iteration, for example, the voltage $V_S$ across sensor 140 results from $I_A+I_{B1}$. Operations 622-628 are repeated (block 630) for each subsequent programmable current source 504(2)-504(n).

At 608, the codes $C_1$ to $C_n$ that are latched into respective latches 514(1)-514(n) can then be stored in memory 160 as biasing data. This can be performed after all the codes $C_1$ to $C_n$ have been determined, or after each code is determined.

After the biasing data (e.g., R-dac_code and $C_1$ to $C_n$) has been determined and stored into memory 160, much of the circuitry shown in FIG. 5 can be used for subsequent active operation of the sensor 140. For example the programmable current sources 206, 504(1)-504(n) can be programmed with the biasing data to source current to the sensor 140 to bias the sensor appropriately.

Figure 7:
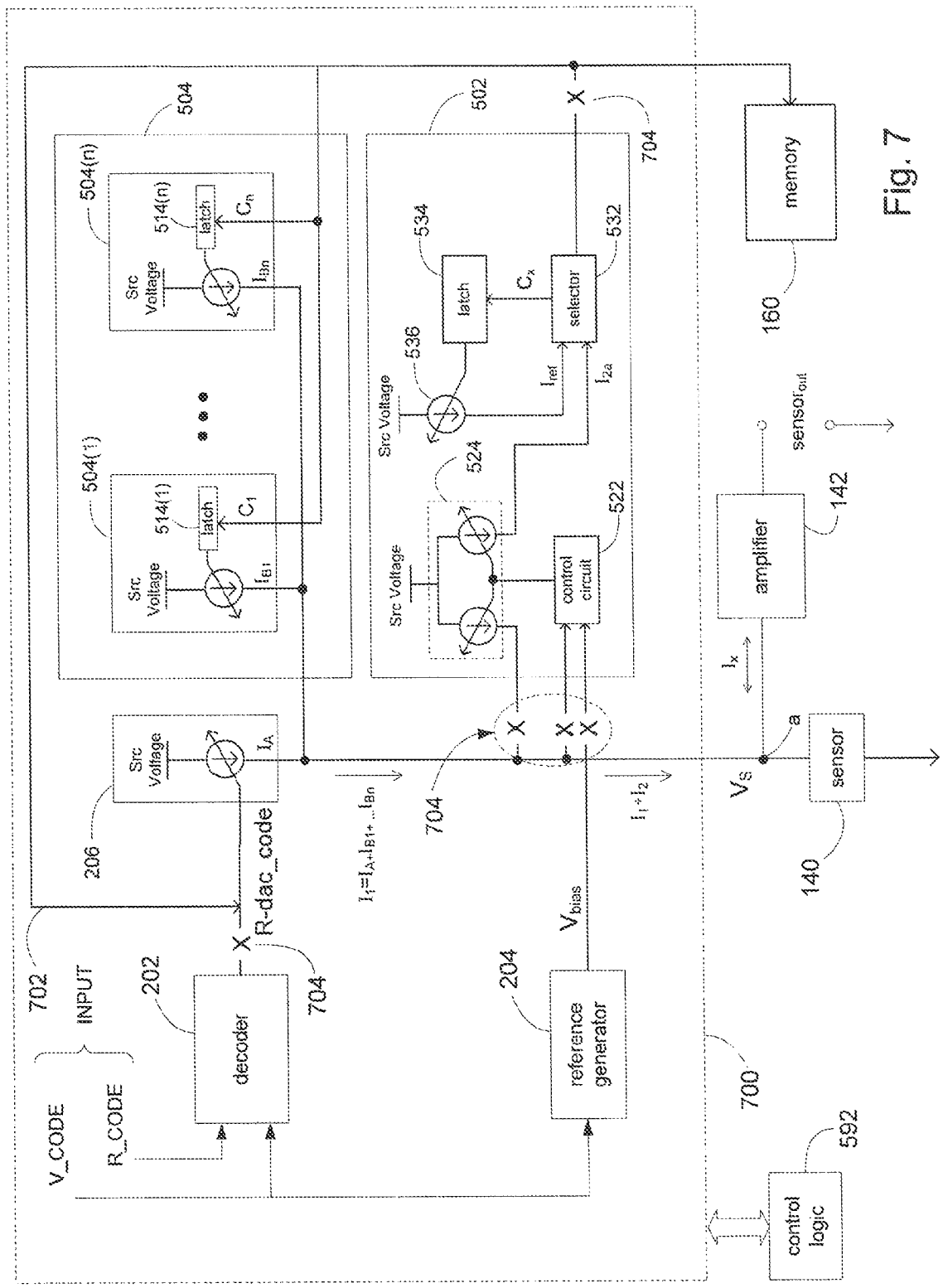
FIGS. 7 and 8 illustrates typical configurations for active operation of a sensor that has been bias in accordance with the present invention.

FIG. 7 shows an embodiment of a bias calibration circuit 700 in accordance with an embodiment of the present invention. The figure shows a data line 702 connecting the memory 160 to the programmable current source 206. Programmable fuses 704 can be provided at certain connections. After the biasing data have been determined and stored in the memory 160, the programmable fuses 704 can be "blown" as shown in FIG. 7 to disconnect certain components that were used to calibrate the sensor 140.

The decoder 202 can be disconnected via the programmable fuse 704 from the programmable current source 206. During active operation, the memory 160 can provide R-dac_code to the programmable current source 206. After the biasing data have been determined, the calibration block 502 can be disconnected via corresponding programmable fuses 704. In addition, power to the disconnected circuits can be removed from the circuits in order to avoid any power drain that may nonetheless occur during quiescent operation of the disconnected circuits. The programmable current sources 504(1)-504(n) can be programmed with the codes $C_1$ to $C_n$ stored in the memory 160. The sensor 140 is thus biased for active operation.

Figure 8:
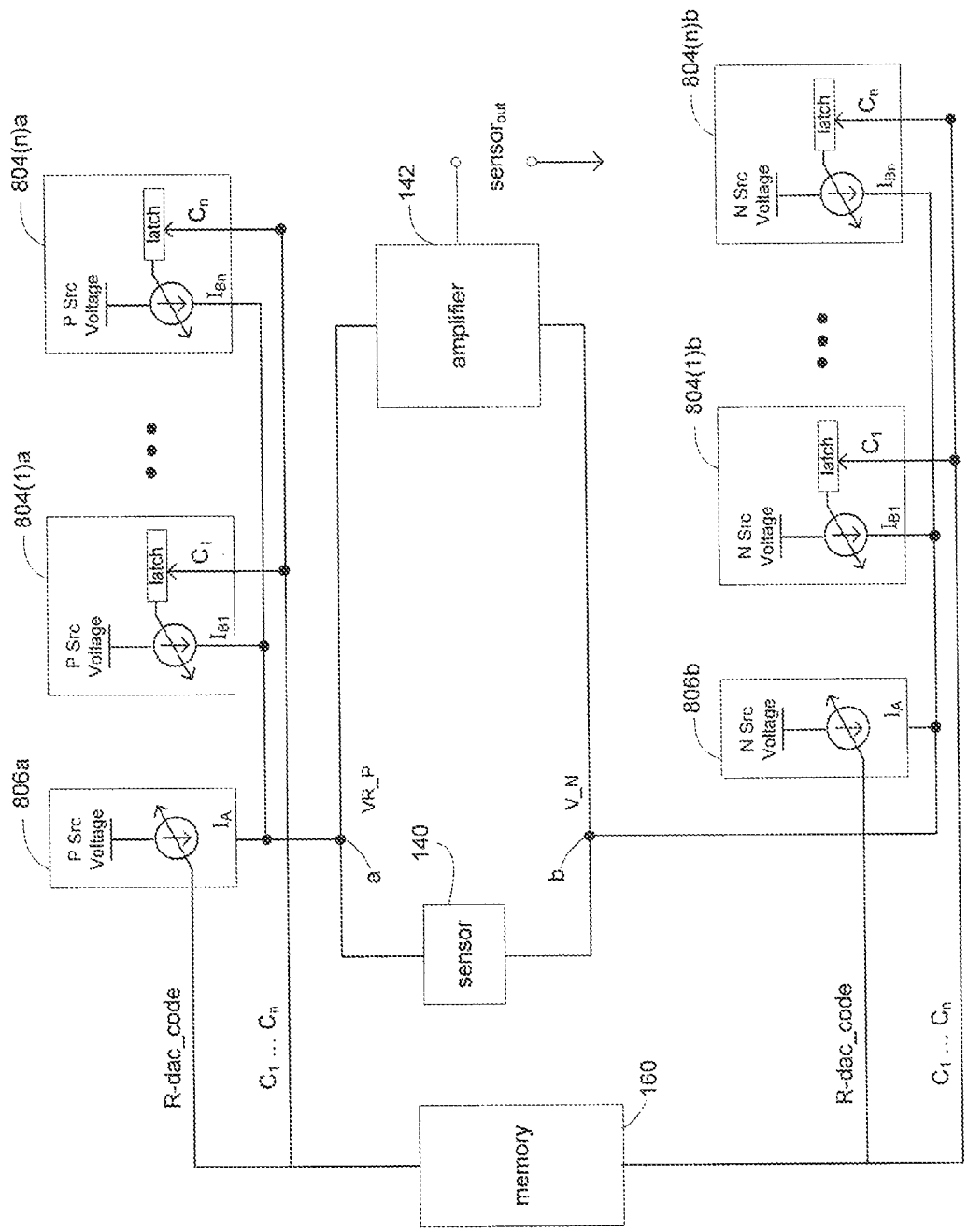

In an embodiment, such as shown in FIG. 8, the sensor 160 can be operated in a differential mode. Here, positively biased programmable currents sources 806a, 804(1)a-804(n)a and negatively biased programmable current sources 806b, 804(1)b-804(n)b are provided. The biasing data stored in the memory 160 can be loaded into the programmable current sources to bias the sensor 140 for active operation.

In FIGS. 7 and 8, operation of the amplifier 142 during active operation typically results in a small current leak $I_x$, whether as a current source or a current sink. As explained above, however, the codes for programming the programmable current sources 504(1)-504(n) were conducted with the amplifier 142 in a powered but otherwise quiescent state to allow for such current leakage to occur. Accordingly, sensor 140 remains appropriately biased despite the leakage current $I_x$.

The above description illustrates various embodiments of the present disclosure along with examples of how aspects of the present disclosure may be implemented. The above examples and embodiments should not be deemed to be the only embodiments, and are presented to illustrate the flexibility and advantages of the present disclosure as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. A circuit for calibrating a sensor comprising:
an input to receive a first data and a second data, the first data representative of a predetermined voltage;
a first programmable current source;
a first circuit coupled to the first programmable current source and configured to produce a first code based on the first data and the second data, wherein the first code can program the first programmable current source to source a first current flowing through the sensor;
a variable current source configured to generate a second current and an alternate second current, the second current added to the first current, the sum of the first current and second current flowing through the sensor is sufficient to create a voltage across the sensor that is less than or equal to the predetermined voltage, the alternate second current develops a second voltage;
a second programmable current source;
a second circuit including a selector and coupled to the second programmable current source, the second programmable current source configured to source a third current that develops a third voltage, the selector configured to determine a second code based on comparing the second voltage with the third voltage; and
a memory to store the first code and the second code.

2. The circuit of claim 1, wherein the first current is greater than the second current.

3. The circuit of claim 1, wherein the second data is indicative of a resistance of the sensor.

4. The circuit of claim 1, further comprising a third programmable current source connected to the sensor, wherein the second circuit is further configured to produce a third code that can program the third programmable current source to source a fourth current.

5. The circuit of claim 4, wherein the first current is greater than the third current, and the third current is greater than the fourth current.

6. The circuit of claim 1, wherein the second circuit further comprises a comparator to compare the predetermined voltage with a voltage across the sensor due to flowing of the first current and the second current.

7. The circuit of claim 6, wherein the second circuit further comprises a variable current source connected to the sensor, and the variable current source produces the second current responsive to an output of the comparator.

8. The circuit of claim 1, further comprising a measuring circuit connected to the sensor, wherein the measuring circuit is configured to provide the second data.

9. A circuit to calibrate a sensor, the circuit comprising:
a decoder configured to receive a first data representative of a reference voltage and a second data representative of a resistance of the sensor, and produce a first code based on the first data and the second data;
a first programmable current source connected to the sensor, and configured to source a first current to the sensor, the first current being determined based on the first code;
a variable current source connected to the sensor, and configured to source a second current to the sensor that varies depending on comparing a voltage across the sensor to a reference voltage, the voltage across the sensor developed by a sum of the first current and the second current, the variable current source further configured to source an alternate second current developing a second voltage;

a second programmable current source configured to source a third current that develops a third voltage;

a selector configured to generate a second code based on the second voltage being compared to the third voltage; and a memory to store the first code and the second code.

10. The circuit of claim 9, wherein the second code is used to program the second programmable current source based on comparing the second voltage with the third voltage.

11. The circuit of claim 9, further comprising a reference generator to output a voltage based on the reference voltage, wherein the variable current source is further configured to source the second current to the sensor that varies depending on a comparison between the voltage across the sensor and the reference voltage.

12. The circuit of claim 9, further comprising a measuring circuit connected to the sensor, wherein the measuring circuit is configured to provide the second data.

13. The circuit of claim 9, further comprising a plurality of additional programmable current sources to source additional currents to the sensor, the plurality of additional programmable current sources being programmed by the selector.

14. A method for calibrating a sensor comprising:

receiving a first data and a second data, the first data representative of a reference voltage;

determining a first code based on the first data and the second data, the first code for programming a first programmable current source;

sourcing a first current to the sensor, the first current being determined by programming the first programmable current source with the first code;

comparing the reference voltage with a voltage across the sensor;

sourcing a second current to the sensor, the second current being determined based on the comparison of the reference voltage with the voltage across the sensor;

sourcing an alternate second current developing a second voltage, the alternate second current being determined based on the comparison of reference voltage with the voltage across the sensor;

sourcing a third current developing a third voltage, the third current being sourced by a second programmable current source;

determining a second code based the comparison of the second voltage with the third voltage; and storing the first code and the second code in a memory.

15. The method of claim 14, wherein the third current produced by the second programmable current source is less than or equal to the second current.

16. The method of claim 14, wherein the third current is sourced by a second programmable current source that is programmed with the second code.

17. The method of claim 16, further comprising:

generating a fourth current based on a comparison of the reference voltage with the voltage across the sensor; and determining a third code based on the fourth current.

18. The method of claim 17, wherein the third current is greater than the fourth current.

19. The method of claim 14, wherein the second data is indicative of a resistance of the sensor.

20. The method of claim 14, wherein the second data is provided by a measuring circuit connected to the sensor.

* * * * *